United States Patent [19]

Charoensakvirochana et al.

[11] Patent Number: 4,644,384
[45] Date of Patent: Feb. 17, 1987

[54] APPARATUS AND METHOD FOR PACKAGING EPROM INTEGRATED CIRCUITS

[75] Inventors: Chamras Charoensakvirochana, Sunnyvale; Wing K. Boey, San Jose, both of Calif.

[73] Assignee: National Semiconductor Corporation, Santa Clara, Calif.

[21] Appl. No.: 576,300

[22] Filed: Feb. 2, 1984

[51] Int. Cl.[4] .................... H01L 23/02; H01L 23/12
[52] U.S. Cl. .................................................... 357/74
[58] Field of Search .......................... 357/74, 80, 84

[56] References Cited

U.S. PATENT DOCUMENTS 4,326,214 4/1982 Trueblood ........................... 357/74
4,506,238 3/1985 Endoh et al. ........................ 357/74

OTHER PUBLICATIONS

McGraw-Hill Encyclopedia of Science & Technology; vol. 11, pp. 529–534, 1982.

Primary Examiner—William L. Sikes
Assistant Examiner—Robert E. Wise
Attorney, Agent, or Firm—Gail W. Woodward

[57] ABSTRACT

An apparatus and a method for forming a protective package for an EPROM circuit are disclosed. The protective package includes a two piece inner ceramic package and a molded outer plastic package. The inner ceramic package includes a base member upon which the chip is mounted for wiring to a lead frame, and also includes a protective cover with a radiation transparent window that covers and protects the chip and wires. The base member and the protective cover are bonded together to hermetically seal the chip. The molded outer plastic package is formed in a mold that includes an elastomeric plug that contacts the top of the window to isolate it from the mold cavity. The plug prevents plastic from covering the top of the window during molding.

2 Claims, 5 Drawing Figures

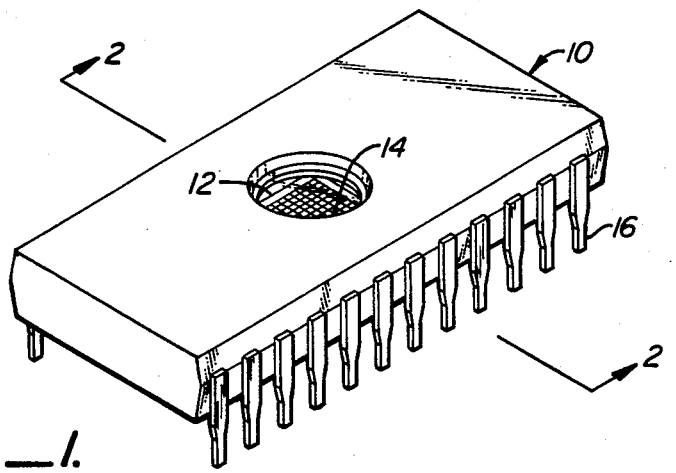
FIG._1.
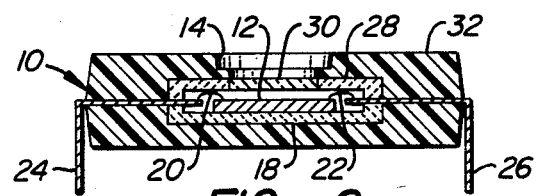
FIG._2.
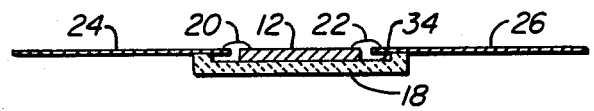
FIG._3.
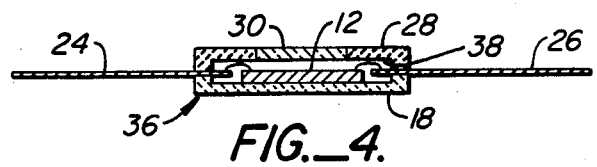
FIG._4.
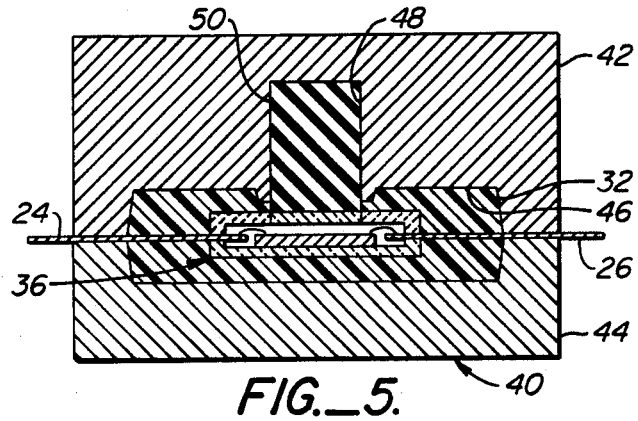
FIG._5.

APPARATUS AND METHOD FOR PACKAGING EPROM INTEGRATED CIRCUITS

BACKGROUND OF THE INVENTION

1. Field of the Invention

This invention relates generally to protective packages suitable for use with semiconductor integrated circuit devices, and relates more particularly to an apparatus and a method for forming a protective package for an EPROM circuit.

2. Description of the Prior Art

One common type of integrated circuit device is known as an erasable programmable read-only memory (EPROM). An EPROM circuit is a memory device that can be reprogrammed. A typical EPROM memory cell has a floating gate that stores a charge to remember one bit of information. To erase this type of memory cell, the charge is drained from the floating gate by exposing the EPROM circuit to radiation, such as ultraviolet light. Once erased, the memory cells of the EPROM circuit can be reprogrammed by supplying additional charges to their floating gates. A radiation transparent window must be provided in the protective package to allow the EPROM circuit to be exposed to radiation.

Integrated circuit chips are commonly housed in protective packages to protect the fragile chips, and to provide convenient packages for handling and interconnection with other electronic circuits. One type of device package from EPROM circuits was disclosed in U.S. Pat. No. 4,326,214 issued on Apr. 20, 1982 to R. K. Trueblood and entitled "Thermal Shock Resistant Package Having an Ultraviolet Light Transmitting Window for a Semiconductor Chip". The Trueblood Patent disclosed a two piece protective package composed of a ceramic material. The protective package included top and bottom pieces, with a glass window bonded to the top piece. To form a protective package the chip was bonded to the bottom piece and wired to a lead frame. Then the top piece was positioned over the chip and was bonded to the bottom piece and lead frame to hermetically seal the chip.

The major disadvantage to the protective package disclosed by Trueblood was its cost. Large ceramic parts are costly to fabricate due to the brittleness of the material.

Integrated circuit chips other than EPROM's have been encapsulated in plastic to provide a low cost protective package. Using this technique, a chip is first wired to a lead frame, then the chip and lead frame are placed in a cavity in a mold and plastic is injected into the cavity. The plastic flows around the chip and lead frame to fill the cavity, and, when cooled, forms a protective package.

Such a technique has been found to be unsuitable for use with EPROM chips because the top surface of a chip must be visible through a radiation transparent window. If a molded plastic protective package is to be used with EPROM chips, isolation means must be provided to isolate the top surface of the chip from the mold cavity to prevent the plastic from covering the top surface of the chip. A major disadvantage to such an approach is that the chip and its wiring are very fragile and susceptible to damage from the isolation means.

SUMMARY OF THE INVENTION

In accordance with the illustrated preferred embodiment, the present invention provides an apparatus and a method for forming a protective package for an EPROM circuit. The protective package is a combination of a two piece inner ceramic package and an outer molded plastic package. The inner ceramic package includes a base member upon which a chip containing the EPROM circuit is mounted for wiring to a lead frame, and also includes a protective cover that covers and protects the chip and wires. The protective cover includes a radiation transparent window that is positioned over the chip to permit erasure of the memory cells of the EPROM circuit. The base member and the protective cover are bonded together to form a subassembly, with the chip and lead frame sandwiched in between.

The outer molded plastic package is molded around the outside of the subassembly by a transfer or injection molding process. A mold is used that includes an elastomeric plug for sealing against the top of the window to isolate it from the cavity of the mold. When the mold is closed, the elastomeric plug is compressed against the top of the window. When plastic is introduced into the cavity of the mold, it encapsulates the entire subassembly except for the window. The elastomeric plug effectively seals the top surface of the window and compensates for dimensional variations in the mold and subassembly, but does not subject the brittle window to high levels of stress.

Accordingly, one aspect of the invention is an apparatus for molding a plastic package over a subassembly containing a radiation transparent window. The apparatus for molding includes a mold with a cavity that defines the outer surface of the plastic package. The apparatus for molding further includes an elastomeric plug disposed opposite the window for sealing against the window during molding. The presence of the elastomeric plug acts to create an opening in the plastic package at the window.

Another aspect of the invention is a protective package for a radiation sensitive integrated circuit chip. The protective package includes a inner cover that covers and protects the chip and its wiring, and that houses a radiation transparent window. The protective package also includes an outer plastic shell that surrounds the inner cover and chip. An opening is provided in the outer plastic shell at the window to allow the chip to be exposed to radiation.

Still another aspect of the invention is a method of packaging a radiation sensitive integrated circuit chip. The method includes the steps of: attaching a base member to a lead frame, attaching the chip to the base member, wiring the chip to the lead frame, attaching a protective cover with a radiation transparent window over the chip and wiring to form a subassembly, placing the subassembly in a mold cavity, closing the mold to compress an elastomeric plug against the window of the protective cover, and introducing plastic into the mold cavity to encapsulate the subassembly except the window.

BRIEF DESCRIPTION OF THE DRAWINGS

FIG. 1 is a perspective view of a packaged EPROM device according to the present invention.

FIG. 2 is a cross-sectional view of the packaged EPROM device of FIG. 1, and is taken along the section line marked A—A in FIG. 1.

FIG. 3 is a cross-sectional view of the packaged EPROM device at a preliminary step, and is also taken along the section line marked A—A in FIG. 1.

FIG. 4 is a cross-sectional view of the packaged EPROM device at a later preliminary step, and is also taken along the section line marked A—A in FIG. 1.

FIG. 5 is a cross-sectional view of the packaged EPROM device and a mold during a molding step, and is also taken along the section line marked A—A in FIG. 1.

DETAILED DESCRIPTION OF THE PREFERRED EMBODIMENT

The preferred embodiment of the present invention provides an apparatus and a method for forming a protective package 10 for an EPROM chip 12, as shown in FIG. 1. Package 10 includes a opening 14 through which chip 12 is visible. The package is illustrated is a standard dual-in-line package and includes two spaced-apart rows of electrical leads 16. Although the present invention is illustrated in reference to a dual-in-line package, the inventive concepts extend to other standard packages as well. In addition, although chip 12 in the preferred embodiment is an EPROM circuit that is erasable when exposed to ultraviolet light, other circuits that are responsive to other types of radiation are also included within the inventive concepts of the present invention. An example of such other type of circuit is a charge coupled imaging device.

FIG. 2 illustrates the details of the construction of package 10. Chip 12 is mounted to the inner surface of a base member 18 and is electrically connected by wires 20 and 22 to leads 24 and 26 of a lead frame. The chip and its wiring are protected from above by a protective cover 28. A radiation transparent window 30 is bonded to the protective cover and is positioned directly over the chip. An outer plastic package 32 encapsulates base member 18 and protective cover 28. Opening 14 is formed in the outer plastic package over window 30 to permit radiation to be applied to the top surface of the chip.

The materials utilized in the preferred embodiment of the protective package 10 are commonly known and used in integrated circuit packaging. Base member 18 and protective cover 28 are composed of a ceramic material, such as alumina. Window 30 is composed of a glass material, such as quartz, chosen to have a coefficient of thermal expansion to be close to that of the ceramic material of the protective cover. The window is bonded to the protective cover according to bonding techniques well known in the art. The outer plastic package 32 is preferably composed of epoxy and is formed by transfer or injection molding, although other plastic materials that are suitable for molding may also be used.

The production cost of package 10 is substantially less than that of an all ceramic package of comparable size. Base member 18 and protective cover 28 act as did the Trueblood package to protect the wiring, to hermetically seal the chip, and to house a radiation transparent window. However, the size of the base member and protective cover package is substantially smaller than that of the Trueblood package, and, accordingly, the cost of the base member and protective cover is also substantially less. The outer plastic package is added at minimal additional cost to result in an inexpensive package.

A method of packaging the EPROM chip 12 is illustrated in FIGS. 3, 4, and 5. The lead frame utilized according to this method does not have a die pad for supporting the chip. Instead, base member 18 provides support for chip 12. At the preliminary step shown in FIG. 3, the lead frame has been bonded to the upper surface of the base member, the chip has been bonded to the upper surface of the base member, and the chip has been wired to the lead frame. Bonding the lead frame and the chip to the base member may be accomplished, for example, by using a heat activated bonding agent that has been preapplied to the upper surface of the base member. After the lead frame and chip are positioned with respect to the base member, the bonding agent is heated to bond the lead frame and chip to the base member. In the preferred embodiment, heating is accomplished in a furnace, and solder glass is used as the bonding agent. A depression 34 in the upper surface of the base member is provided to position the top surface of the chip at the same level as the leads to facilitate wire bonding of wires 20 and 22 between the chip and the lead frame.

The next step in the method of packaging chip 12 is shown in FIG. 4. Protective cover 28 is bonded to the top of the lead frame to form a subassembly 36. An offset 38 in the lower surface of the protective cover provides clearance for the chip and its wiring. Window 30 is positioned directly above the top surface of the chip. The protective cover and the base member are bonded to the lead frame by a bonding agent, such as solder glass. In the preferred embodiment, the bonding agents are thermally activated and serve to seal the interfaces between the protective cover, base member, and lead frame to hermetically seal the interior of the subassembly.

After the subassembly 36 is formed, it is inserted into a mold 40 for forming the outer plastic package 32. Mold 40 is of typical transfer or injection mold construction, and is formed of two halves 42 and 44 that define a mold cavity 46. The mold includes a plug cavity 48 into which an elastomeric plug 50 is inserted. In the preferred embodiment, the elastomeric plug 50 is composed of silicone rubber having a hardness approximately equal to a durometer number of eighty. Plug 50 is cylindrical in shape, and is positioned such that the lower base thereof contacts the window 30 when the subassembly is in the mold. The length of plug 50 is slightly longer than the distance from the top of the window to the top of the plug cavity, which causes plug 50 to be compressed when the subassembly is in the mold. This forms an effective seal to isolate the top surface of the window from the mold cavity. The compressibility of the plug compensates for dimensional variations in the mold and subassembly without subjecting the brittle window to high levels of stress.

To form the outer plastic package 32, the subassembly 36 is first inserted into mold 40. The mold is then closed to compress the elastomeric plug to seal against the window. Plastic is then introduced into the mold to form the outer plastic package that encapsulates the protective cover and base member. The plug prevents plastic from covering the window, thus forming opening 14. The combination of the mold cavity and the plug defines the outer shape of the plastic package. After the plastic has sufficiently hardened, the now completed package 10 is removed from the mold. Subsequent processing steps for trimming mold flash and bending the leads of the lead frame are well known and need not be described herein.

From the above description, it will be apparent that the invention disclosed herein provides a novel and advantageous apparatus for forming a protective package for an EPROM circuit. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. An apparatus for molding a protective package around a subassembly, wherein the subassembly includes an integrated circuit chip and a protective cover disposed over the chip, and wherein the cover has a radiation transparent window positioned proximate the chip, said apparatus comprising:
    a mold defining a cavity, said cavity is operable for receiving said subassembly and for defining the outer shape of said protective package upon the injection of a moldable material into said cavity; and
    a silicone rubber plug having a hardness approximately equal to a durometer number of eighty disposed within said cavity and positioned adjacent to and contacting the window of said subassembly, said plug being compressed against said window by the closure of said mold for sealing off the outer surface of the window from said cavity to provide an opening in said protective package.

2. A method for packaging a radiation sensitive integrated circuit chip, said method comprising the steps of:
    attaching a base member to one side of a lead frame;
    attaching said chip to said base member, and wiring said chip to said lead frame;
    positioning a protective cap over said chip and attaching it to the other side of said lead frame to form a subassembly, said protective cap having a radiation transparent window positioned proximate said chip;
    placing said subassembly into a cavity of a mold, said mold including a silicon rubber plug having a hardness substantially equal to a durometer number of eighty disposed adjacent to said window;
    closing said mold to compress and seal said plug against the outer surface of said window; and
    introducing moldable material into the cavity of the mold to encapsulate said subassembly, with said plug acting to prevent said moldable material from covering said window.

* * * * *